(12) United States Patent
Takekida

(10) Patent No.: US 10,607,935 B2
(45) Date of Patent: Mar. 31, 2020

(54) MEMORY DEVICE

(71) Applicant: TOSHIBA MEMORY CORPORATION, Tokyo (JP)

(72) Inventor: Hideto Takekida, Nagoya Aichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/906,890

(22) Filed: Feb. 27, 2018

(65) Prior Publication Data

US 2019/0088587 A1    Mar. 21, 2019

(30) Foreign Application Priority Data

Sep. 15, 2017 (JP) ................ 2017-178339

(51) Int. Cl.

| | |
|---|---|
| H01L 23/58 | (2006.01) |
| H01L 23/528 | (2006.01) |
| H01L 27/1157 | (2017.01) |
| H01L 21/768 | (2006.01) |
| H01L 23/522 | (2006.01) |
| H01L 27/11582 | (2017.01) |
| H01L 27/11565 | (2017.01) |

(52) U.S. Cl.

CPC ...... *H01L 23/528* (2013.01); *H01L 21/76816* (2013.01); *H01L 21/76877* (2013.01); *H01L 23/5226* (2013.01); *H01L 27/1157* (2013.01); *H01L 27/11582* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 7,936,004 B2 | 5/2011 | Kito et al. | |
| 2019/0043885 A1* | 2/2019 | Lee | .......... H01L 29/66833 |

FOREIGN PATENT DOCUMENTS

| | | | |
|---|---|---|---|
| JP | 2007-266143 A | 10/2007 | |

\* cited by examiner

*Primary Examiner* — Long Pham
(74) *Attorney, Agent, or Firm* — Kim & Stewart LLP

(57) ABSTRACT

A memory device comprises electrode layers stacked in a stacking direction. Semiconductor pillars penetrate the electrode layers in the stacking direction. First wirings are disposed above the plurality of electrode layers at a first level. Each first wiring is electrically connected to a semiconductor pillar. A second wiring is disposed above the plurality of electrode layers at the first level. The second wiring is insulated from semiconductor pillars. The second wiring and the first wirings extend in parallel along a first direction intersecting the stacking direction and are spaced from each other in a second direction. A width of the second wiring the second direction is equal to a width of each first wiring. A spacing distance between the second wiring and a nearest first wiring is greater than a spacing interval between adjacent first wirings.

14 Claims, 9 Drawing Sheets

MEMORY DEVICE

CROSS-REFERENCE TO RELATED APPLICATION

This application is based upon and claims the benefit of priority from Japanese Patent Application No. 2017-178339, filed Sep. 15, 2017, the entire contents of which are incorporated herein by reference.

FIELD

Embodiments described herein relate generally to a memory device.

BACKGROUND

In memory devices having a large storage capacity, such as NAND-type flash memory, the miniaturization of such devices by reducing the size of memory cells and the associated wirings (e.g., word lines and bit lines) has been explored. In such miniaturized memory devices, the operation speed of the memory cells for reading and writing becomes limited by the parasitic capacitance and the parasitic resistance of the miniaturized wirings.

DETAILED DESCRIPTION

Figure 1:
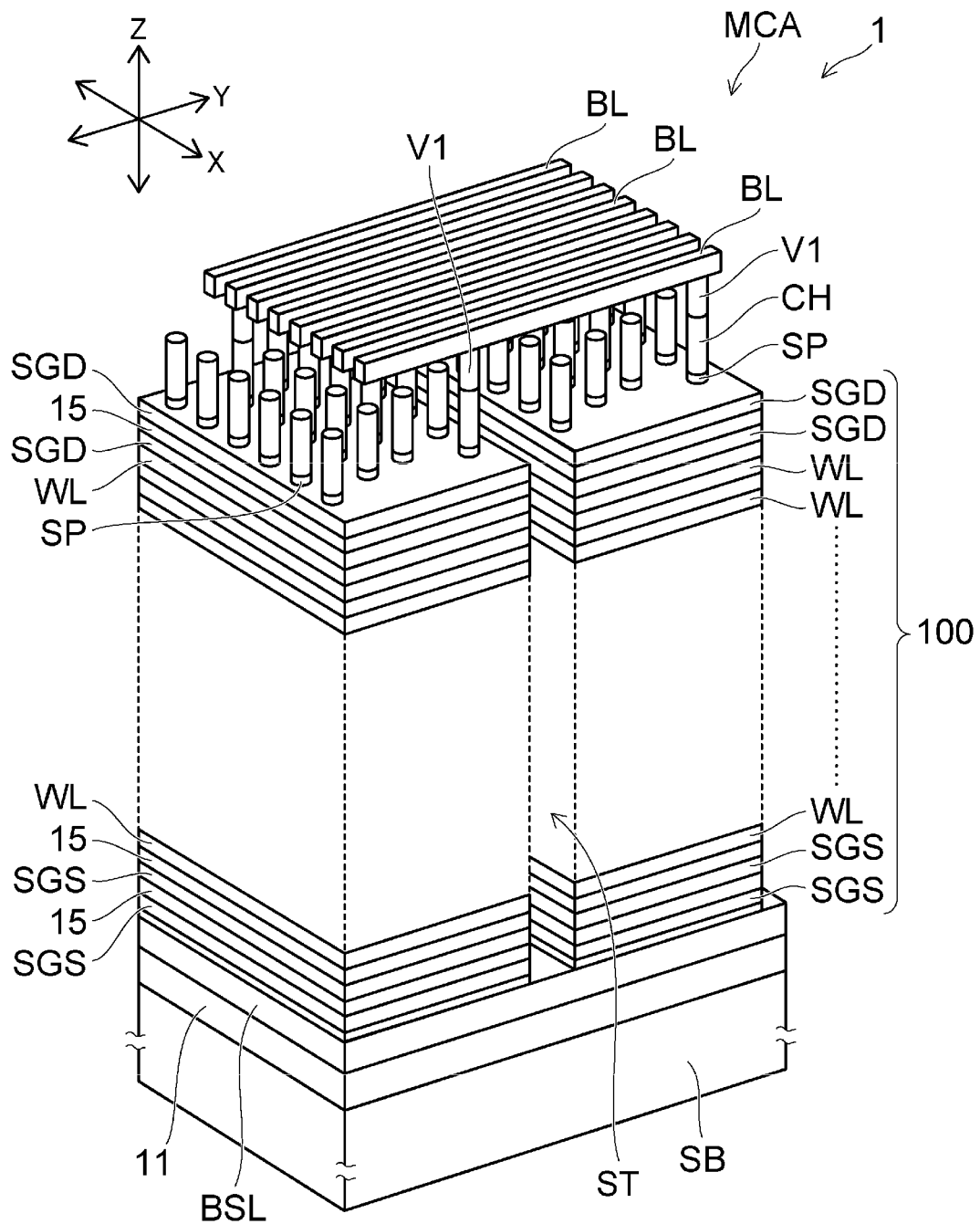
FIG. 1 is a perspective view schematically illustrating a memory device according to a first embodiment.

Embodiments provide a memory device having increased operational speed.

In general, according to one embodiment, a memory device, comprises a plurality of electrode layers stacked on each other in a stacking direction; a plurality of semiconductor pillars penetrating the plurality of electrode layers in the stacking direction; a plurality of first wirings disposed above the plurality of electrode layers in the stacking direction at a first level, each first wiring being electrically connected to at least one semiconductor pillar in the plurality of semiconductor pillars; and a second wiring disposed above the plurality of electrode layers in the stacking direction at the first level, the second wiring being insulated from the plurality of semiconductor pillars. The second wiring and the plurality of first wirings extend in parallel along a first direction intersecting the stacking direction and are spaced from each other in a second direction intersecting both the stacking direction and the first direction. A width of the second wiring in the second direction is equal to a width of each first wiring in the plurality of first wirings in the second direction. A spacing distance along the second direction between the second wiring and a nearest first wiring in the plurality of first wirings is greater than a spacing interval along the second direction between adjacent first wirings.

Hereinafter, example embodiments will be described with reference to the drawings. In the drawings, the same parts are denoted by the same reference numbers. Detailed description of repeated aspects will be omitted as appropriate, and differences will be primarily described. In general, the drawings are schematic and/or conceptual, and, as such, the relationship between depicted thickness and width of each aspect, the ratio of the sizes between different aspects or portions, and the like are not necessarily the same as those in an actual device or process. In addition, even in the case of representing the same aspect or portion in different drawings, the dimension and ratio of the aspect or portion may be illustrated differently depending on the drawing.

Further, the example embodiments will be described using the X axis, Y axis, and Z axis as illustrated in the drawings. In general, the X axis, the Y axis, and the Z axis are orthogonal to each other and represent the X direction, the Y direction, and the Z direction, respectively. In addition, for explanatory convenience, one direction along the Z axis may be described as an upward direction, and the opposite direction thereof may be described as a downward direction.

(First Embodiment)

FIG. 1 is a perspective view schematically illustrating a memory cell array MCA of a memory device 1 according to a first embodiment. The memory device 1 is, for example, a NAND flash memory device, and the memory cell array MCA includes three-dimensionally arranged memory cells MC. In FIG. 1, in order to better display the structure of the memory cell array MCA, a part of an insulating film is omitted for the sake of convenience.

As illustrated in FIG. 1, the memory cell array MCA is provided above a substrate SB, and includes a source line BSL and a stacked body 100. The substrate SB is, for example, a silicon substrate. The source line BSL is provided above the substrate SB with an interlayer insulating film 11 being interposed therebetween. For example, a circuit element (not specifically illustrated) for driving the memory cell array MCA may be provided above the upper surface of the substrate SB. A plurality of stacked bodies 100 are provided above the source line BSL. A slit ST is provided between adjacent stacked bodies 100.

Each stacked body 100 includes selection gates SGS, word lines WL, and selection gates SGD. The selection gates SGS, the word lines WL, and the selection gates SGD are stacked in the Z direction with interlayer insulating films 15 being interposed therebetween.

The memory cell array MCA further comprises a plurality of semiconductor pillars SP that extend through the stacked body 100 in the Z direction. The semiconductor pillars SP are each electrically connected to a bit line BL in a plurality of bit lines BL provided above the stacked body 100. The bit lines BL extend in the Y direction across a plurality of stacked bodies 100. Each semiconductor pillar SP is connected to the bit line BL via a connection plug CH and a connection plug V1 in series.

Figure 2:
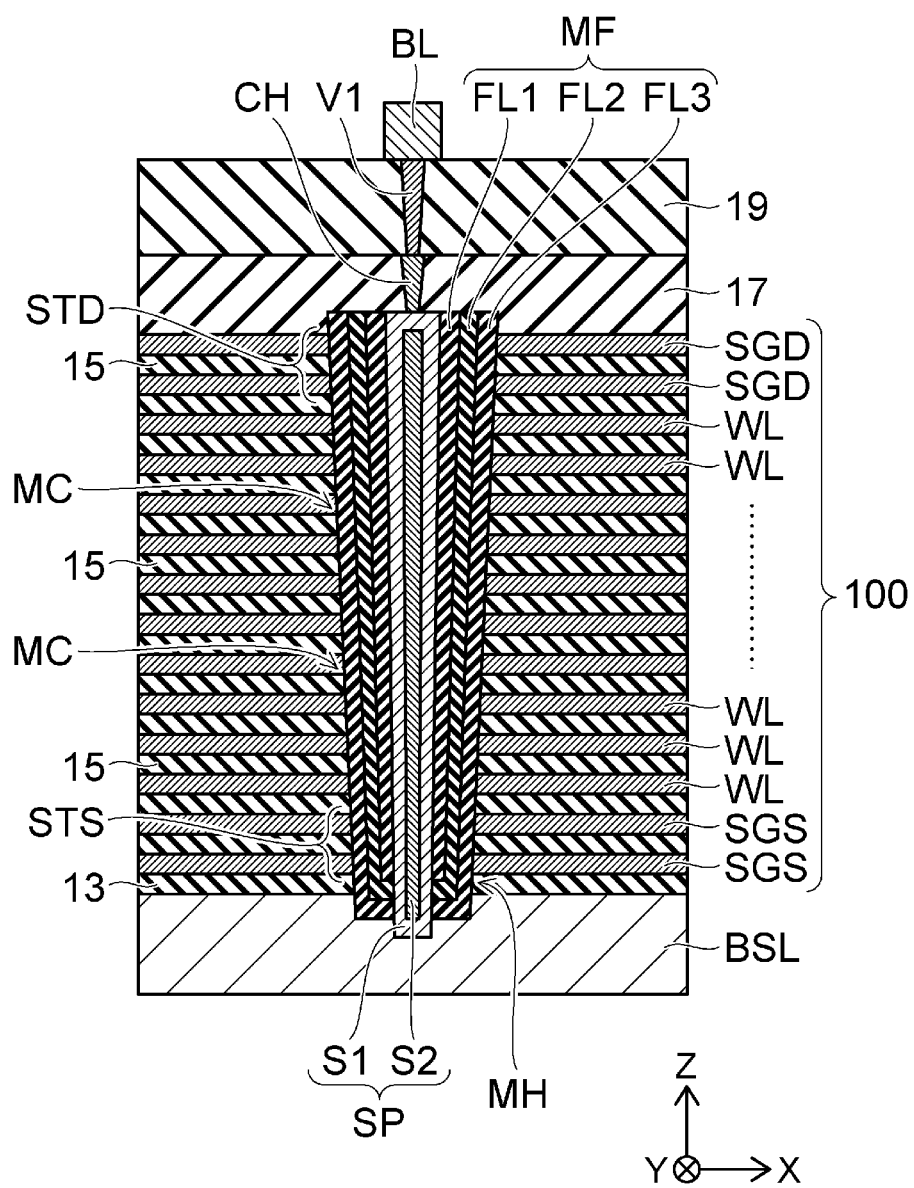
FIG. 2 is a partial cross-sectional view schematically illustrating the memory device according to the first embodiment.

FIG. 2 is a partial cross-sectional view schematically illustrating the memory device 1 according to the first embodiment. FIG. 2 is a schematic cross-sectional view illustrating a semiconductor pillar SP penetrating the stacked body 100.

As illustrated in FIG. 2, the semiconductor pillar SP is located inside of a memory hole MH provided in the stacked body 100. The memory hole MH extends from the upper surface of the stacked body 100 to the source line BSL through the selection gates SGD, the word lines WL, the selection gates SGS, and the interlayer insulating films 13 and 15.

The interlayer insulating film 13 is provided between the source line BSL and the lowermost selection gate SGS. Each interlayer insulating film 15 is provided between two conductive layers, which are adjacent to each other in the Z direction, from among the selection gates SGS, the word lines WL, and the selection gates SGD. The interlayer insulating films 13 and 15 are, for example, silicon oxide films. The selection gates SGS, the word lines WL, and the selection gates SGD are metal layers including, for example, tungsten (W).

The semiconductor pillar SP extends in the Z direction and includes a semiconductor film S1 and an insulating core S2. The insulating core S2 extends in the Z direction, and the semiconductor film S1 wraps around the surface of the insulating core S2. The semiconductor film S1 is, for example, a polysilicon film, and the insulating core S2 is, for example, silicon oxide.

The lower end of the semiconductor pillar SP is connected to the source line BSL. In addition, the upper end of the semiconductor pillar SP is connected to the bit line BL via the connection plugs CH and V1. The connection plugs CH and V1 extend through interlayer insulating films 17 and 19 in the Z direction, respectively. The interlayer insulating films 17 and 19 are, for example, silicon oxide films.

A memory film MF is provided between the semiconductor pillar SP and the inner wall of the memory hole MH. The memory film MF includes, for example, a tunnel insulating film FL1, a charge holding film FL2, and a block insulating film FL3. The tunnel insulating film FL1 is located between the semiconductor pillar SP and the charge holding film FL2. The block insulating film FL3 is located between the charge holding film FL2 and the word line WL. The tunnel insulating film FL1 and the block insulating film FL3 are, for example, silicon oxide films. The charge holding film FL2 is, for example, a silicon nitride film.

The memory cells MC are formed at the intersections of the word lines WL and the semiconductor pillar SP. Each of the memory cells MC comprises a part of a memory film MF located between the word line WL and the semiconductor pillar SP. The part of the memory film MF serves as memory storage portion. In addition, selection transistors STS are formed where the semiconductor pillar SP and the selection gates SGS intersect. Selection transistors STD are formed where the semiconductor pillar SP and the selection gates SGD intersect.

Figure 3A:
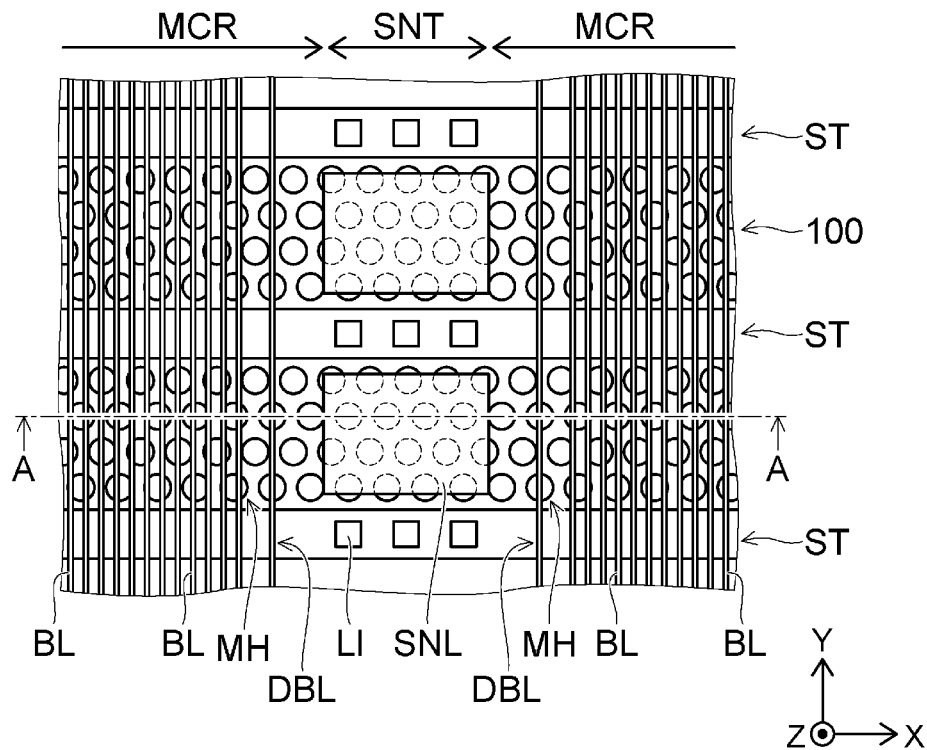
FIGS. 3A and 3B are schematic views illustrating wirings of the memory device according to the first embodiment.
Figure 3B:
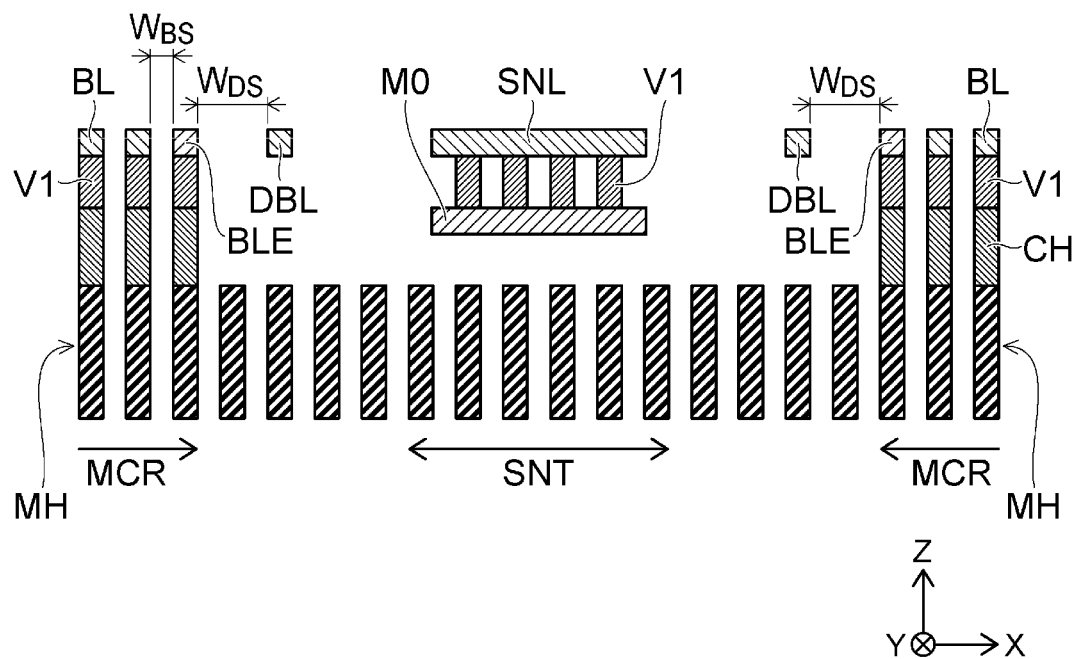

FIGS. 3A and 3B are schematic views illustrating wirings of the memory device 1 according to the first embodiment. FIG. 3A is a plan view illustrating the memory cell array MCA when viewed from the top. FIG. 3B is a cross-sectional view taken along line A-A in FIG. 3A. In FIG. 3B, the word lines WL, the selection gates SGD, and the interlayer insulating films are not illustrated for the sake of convenience.

As illustrated in FIG. 3A, stacked bodies 100 are arranged along the Y direction with a slit ST interposed therebetween.

Each stacked body 100 extends in the X direction. Therefore, the word lines WL, the select gates SGS, and the selection gates SGD also extend in the X direction. The memory holes MH are arranged in a staggered or offset manner within each stacked body 100.

The memory cell array MCA has, for example, a memory cell region MCR and a shunt region SNT within the X-Y plane. The bit lines BL are provided in the memory cell region MCR and extend in the Y direction. In the shunt region SNT, the lead lines LI are provided. The lead lines LI are located inside the slits ST, as viewed from above, and electrically connect the source line BSL and the wirings located above the memory cell array MCA.

As illustrated in FIG. 3B, the memory holes MH are provided in both the memory cell region MCR and the shunt region SNT. In the memory cell region MCR, the semiconductor pillars SP in each memory hole are electrically connected to the bit lines BL.

In the shunt region SNT, a wiring M0 is provided and electrically connected to the lead lines LI. The wiring M0 electrically connects the source line BSL and a driving circuit (not specifically illustrated). Furthermore, a shunt line SNL is electrically connected to the wiring M0 via the connection plugs V1. As a result, the wiring resistance between the source line BSL and the driving circuit may be reduced.

In a boundary region between the memory cell region MCR and the shunt region SNT, a dummy bit line DBL is located. The dummy bit line DBL is located above a memory hole MH, but is not electrically connected to the semiconductor pillar SP therein.

The dummy bit line DBL is provided, for example, at the edge of the plurality bit lines BL regularly arranged in the X direction in a memory cell region MCR. The dummy bit line DBL extends in the Y direction and is provided such that its width in the X direction is substantially equal to that of the bit lines BL. The dummy bit line DBL is provided, for example, to limit or reduce pattern dependent effects in the formation of the bit lines BL within a memory cell region MCR where the regularity of arrangement of the bit lines BL is crucial. That is, the dummy bit line DBL is provided in a region where line widths and intervals of the bit lines BL that would be possibly formed might be different from those in the memory cell region MCR due to pattern density dependent or edge effects in photolithography or etching processes.

In the example illustrated in FIG. 3B, the interval $W_{DS}$ along the X direction from a bit line BLE that is disposed at an edge the bit lines BL in the memory cell region MCR to the dummy bit line DBL that is closest the bit line BLE is greater than the interval $W_{BS}$ along the X direction between adjacent bit lines BL.

Figure 4A:
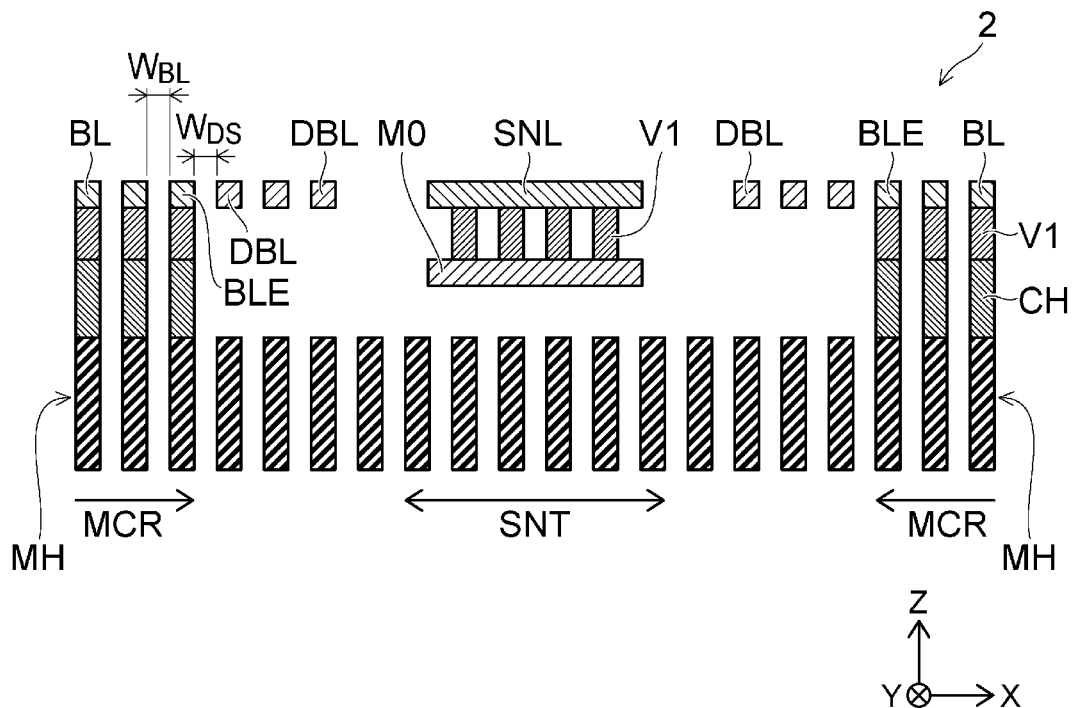
FIGS. 4A and 4B are schematic views illustrating wirings of a memory device according to a comparative example.
Figure 4B:
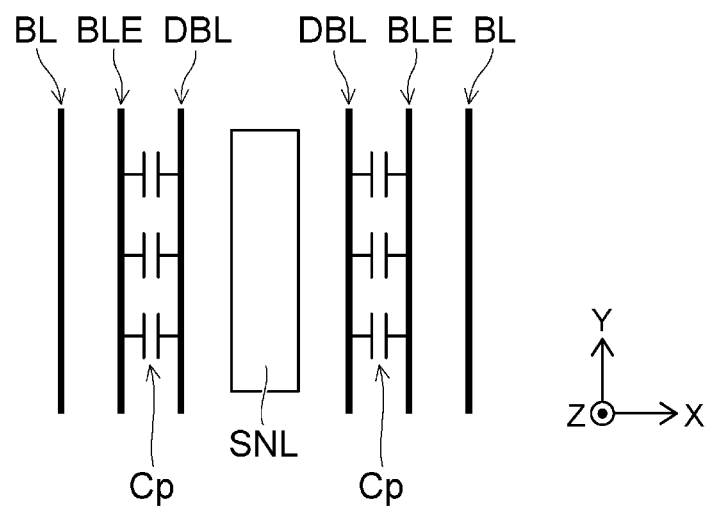

FIGS. 4A and 4B are schematic views illustrating wirings of a memory device 2 according to a comparative example. FIG. 4A is a cross-sectional view corresponding to a portion taken along line A-A in FIG. 3A. FIG. 4B is a plan view illustrating general arrangement of the bit lines BL, the dummy bit lines DBL, and the shunt line SNL.

As illustrated in FIG. 4A, the interval $W_{DS}$ between the bit line BLE and the nearest dummy bit line DBL thereto is set to be substantially equal to the interval $W_{BL}$ that is between adjacent bit lines BL. As illustrated in FIG. 4B, a parasitic capacitance Cp exists between the bit line BLE and the nearest dummy bit line DBL.

Figure 5:
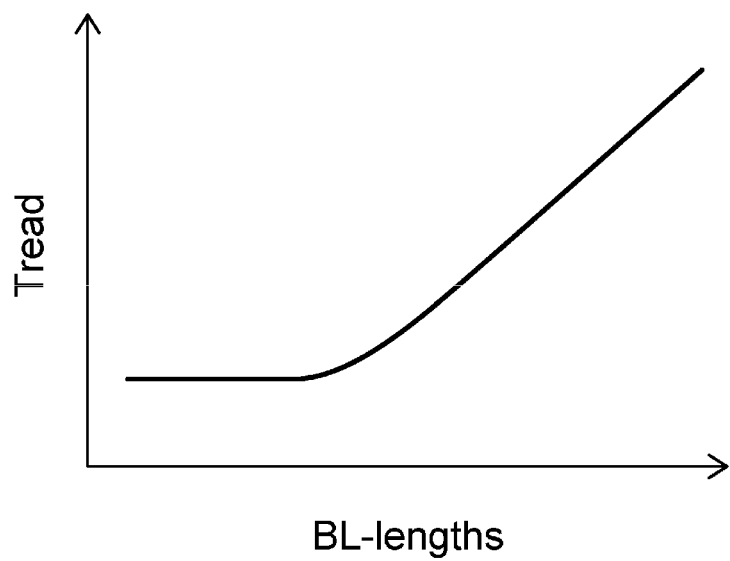
FIG. 5 is a schematic view illustrating operational characteristics of a memory device according to the first exemplary embodiment.

FIG. 5 is a chart illustrating possible characteristics of a memory device 1 according to the first exemplary embodiment. The vertical axis represents a read time Tread for when data is read out from the memory cells MC. The horizontal axis represents lengths of the bit lines BL in the memory device 1.

As illustrated in FIG. 5, once the lengths of the bit lines BL exceed a certain point, the read time Tread becomes substantially dependent on the length of the bit lines BL. For example, when the bit lines BL become long (beyond the inflection point in FIG. 5), the parasitic capacitance between the bit lines BL increases and the electric resistance of the bit lines BL also increases. Therefore, the speed of a signal transmitted through the bit lines BL is also limited, so that the read time Tread increases. However, as the lengths of the bit lines BL become shorter (less than the inflection point in FIG. 5), the read time Tread becomes limited by other factors, for example, the parasitic capacitance and the electric resistance of the word lines WL.

When a dummy bit line DBL is located near the bit lines BL, the read time Tread in general increases. The dummy bit line DBL is not connected to the semiconductor pillar SP is at a floating potential and the influence of any parasitic capacitance Cp between the bit line BLE and the dummy bit line DBL becomes more significant as the distance between bit line BLE and dummy bit line DBL is decreased, and the read time Tread increases.

In contrast, in the memory device 1 according to the first embodiment, the interval $W_{DS}$ between the bit line BLE and the dummy bit line DBL is set to be wider than the interval $W_{BS}$ between the bit lines BL. As a result, the parasitic capacitance Cp between the bit line BLE and the dummy bit line DBL is reduced, so that the influence on the read time Tread may be reduced. That is, it is possible to increase the operation speed of the memory cells MC.

A method of manufacturing the memory device 1 will be described with reference to FIGS. 6A to 8C. FIGS. 6A to 8C are schematic cross-sectional views illustrating a manufacturing process of the memory device according to the first embodiment, and illustrate a process of forming the bit lines BL.

Figure 6A:
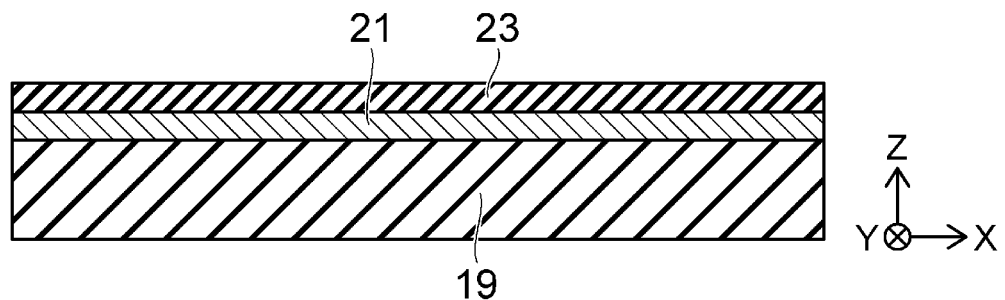
FIGS. 6A, 6B, and 6C are schematic cross-sectional views illustrating aspects of a manufacturing process of the memory device according to a first embodiment.

As illustrated in FIG. 6A, a metal film 21 and a mask layer 23 are formed on an interlayer insulating film 19. The metal film 21 is, for example, a tungsten film. The mask layer 23 is, for example, an amorphous silicon layer.

Figure 6B:
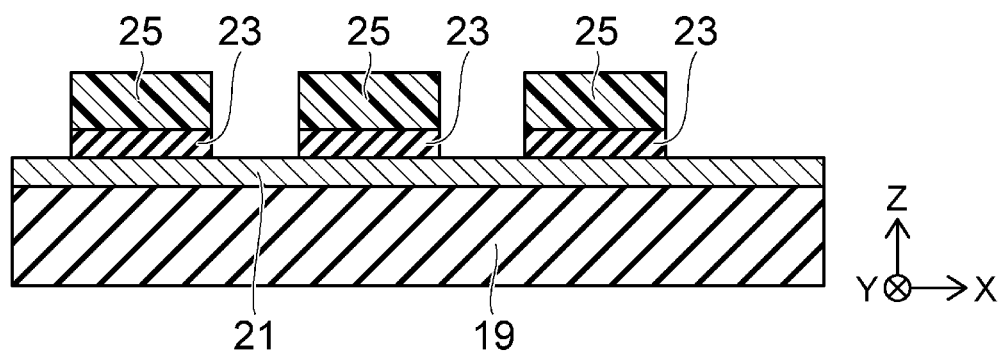

As illustrated in FIG. 6B, for example, a resist mask 25 is formed on the mask layer 23 by photolithography, and the mask layer 23 is selectively removed. The resist mask 25 is, for example, a line-and-space pattern extending in the Y direction.

Figure 6C:
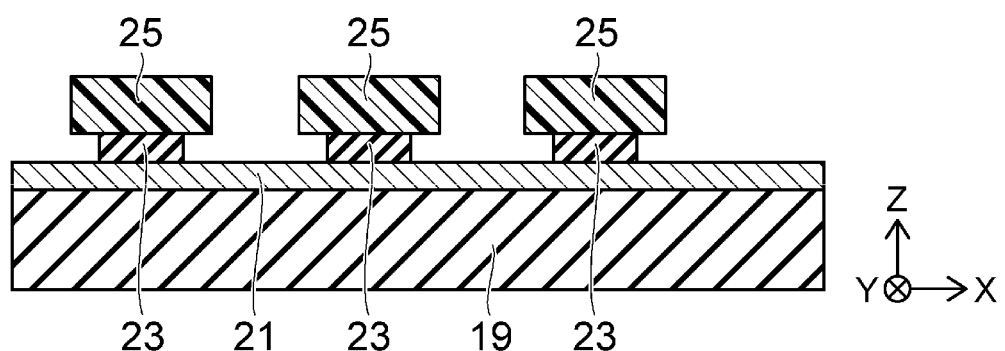

As illustrated in FIG. 6C, the width of the mask layer 23 in the X direction is narrowed. Specifically, while the resist mask 25 remains on the mask layer 23, the mask layer 23 is further etched by isotropic etching such as wet etching.

Figure 7A:
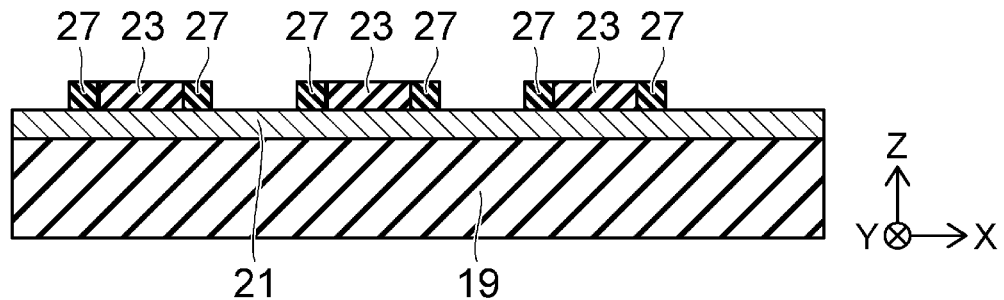
FIGS. 7A, 7B, and 7C are schematic cross-sectional views illustrating further aspects of a manufacturing process.

As illustrated in FIG. 7A, side walls 27 are formed around the mask layer 23. The side walls 27 are, for example, silicon nitride films, and are formed to be in contact with the lateral surface of the mask layer 23. For example, after the silicon nitride film is formed to cover the metal film 21 and the mask layer 23, the silicon nitride film formed on the upper surface of the metal film 21 and the upper surface of the mask layer 23 are partially removed by anisotropic RIE. Therefore, the upper surfaces of the metal film 21 and the mask layer 23 may be exposed while leaving the side walls 27 on the lateral surface of the mask layer 23.

Figure 7B:
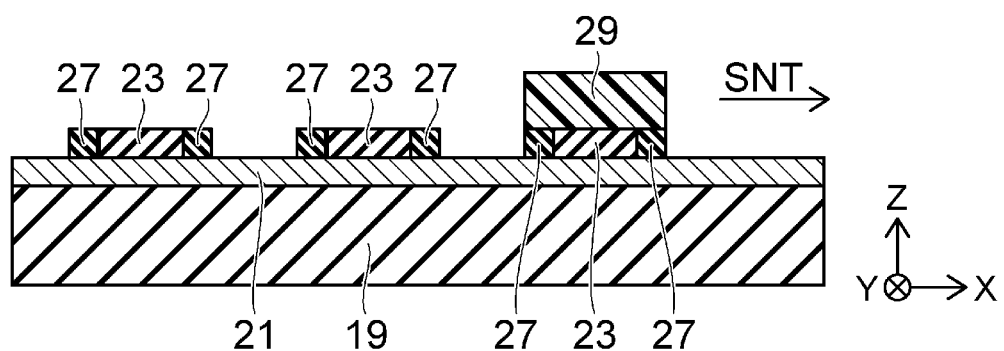

As illustrated in FIG. 7B, a resist mask 29 is formed on the mask layer 23 located at the end on the shunt region SNT side. The resist mask 29 is formed to cover, for example, the mask layer 23 and the side walls 27 formed on both sides of the mask layer 23.

Figure 7C:
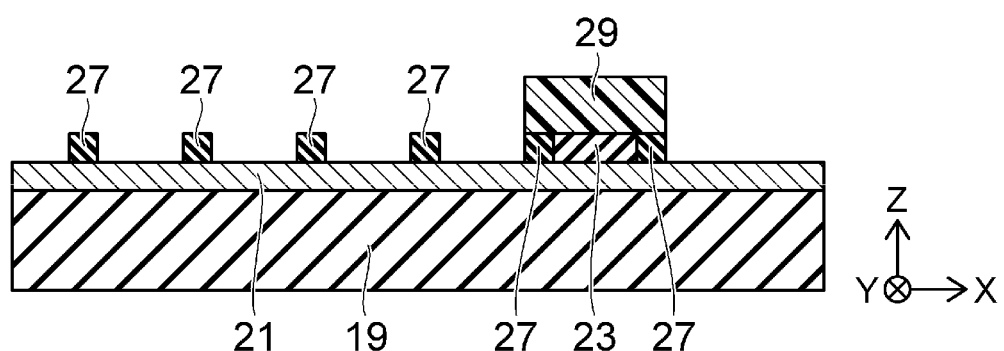

As illustrated in FIG. 7C, the mask layer 23 is selectively removed such that the side walls 27 remain on the metal film 21. At this time, the mask layer 23 covered with the resist mask 29 remains on the metal film 21.

Figure 8A:
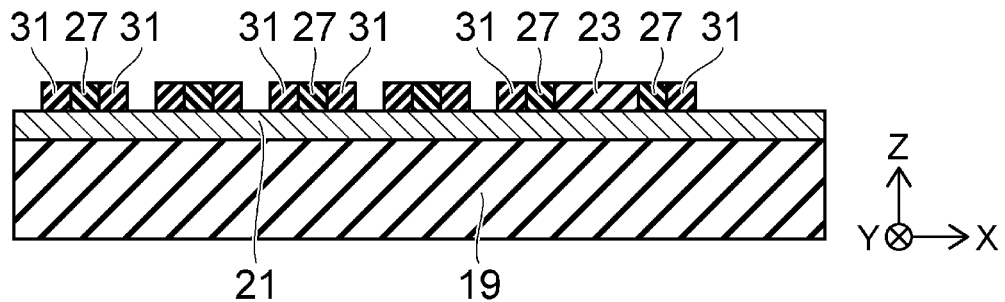
FIGS. 8A, 8B, and 8C are schematic cross-sectional views illustrating additional aspects of a manufacturing process.

As illustrated in FIG. 8A, side walls 31 are formed on both sides of each side wall 27. The side walls 31 are, for example, silicon oxide films. At this time, in the portion where the mask layer 23 remains, the side walls 31 are formed on the lateral surfaces of the side walls 27 located on both sides of the mask layer 23.

Figure 8B:
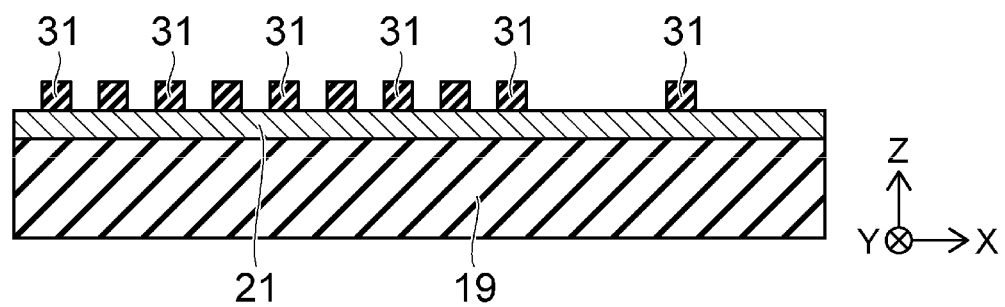

As illustrated in FIG. 8B, the mask layer 23 and the side walls 27 are removed such that the side walls 31 remain on the metal film 21.

Figure 8C:
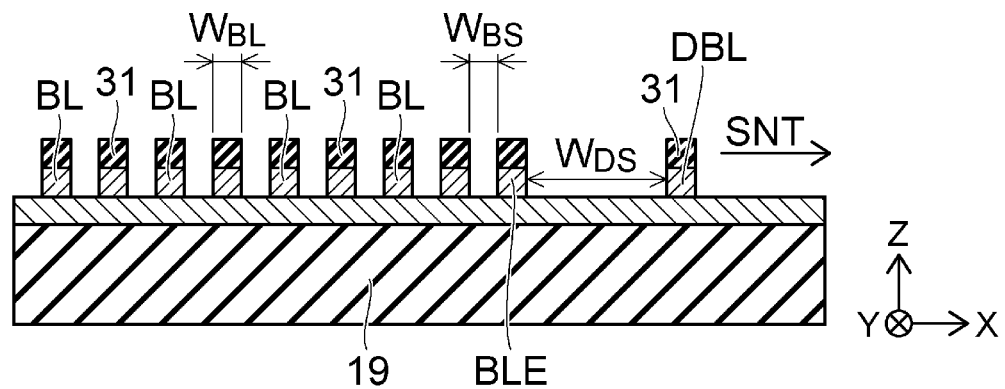

As illustrated in FIG. 8C, the metal film 21 is selectively removed using the side walls 31 as a mask such that bit lines BL are formed on the interlayer insulating film 19. As a result, a dummy bit line DBL is formed under the side wall 31 located on the shunt region SNT side. The interval $W_{DS}$ between the dummy bit line DBL and the bit line BLE located on the shunt region SNT side is formed to be wider than the interval $W_{BS}$ between the adjacent bit lines BL in the X direction. For example, when the width $W_{BL}$ of each of the bit lines BL in the X direction is equal to the interval $W_{BS}$, the interval $W_{DS}$ between the bit line BLE and the dummy bit line DBL is about five times longer than the half interval $W_{BS}$ between the bit lines BL in the X direction.

In the first embodiment, by using the side walls 27 and 31, it is possible to form the bit lines BL each having a narrower width in the X direction than that of the resist mask 25. For example, when the width of the resist mask 25 in the X direction is close to the resolution limit of photolithographic patterning tool, it is still possible to form the bit lines BL each having a narrower line width despite the resolution limit. Furthermore, by leaving the mask layer 23, it is possible to form the dummy bit line DBL arranged at an interval wider than the wiring pitch with respect to the bit lines BL.

(Second Embodiment)

Figure 9A:
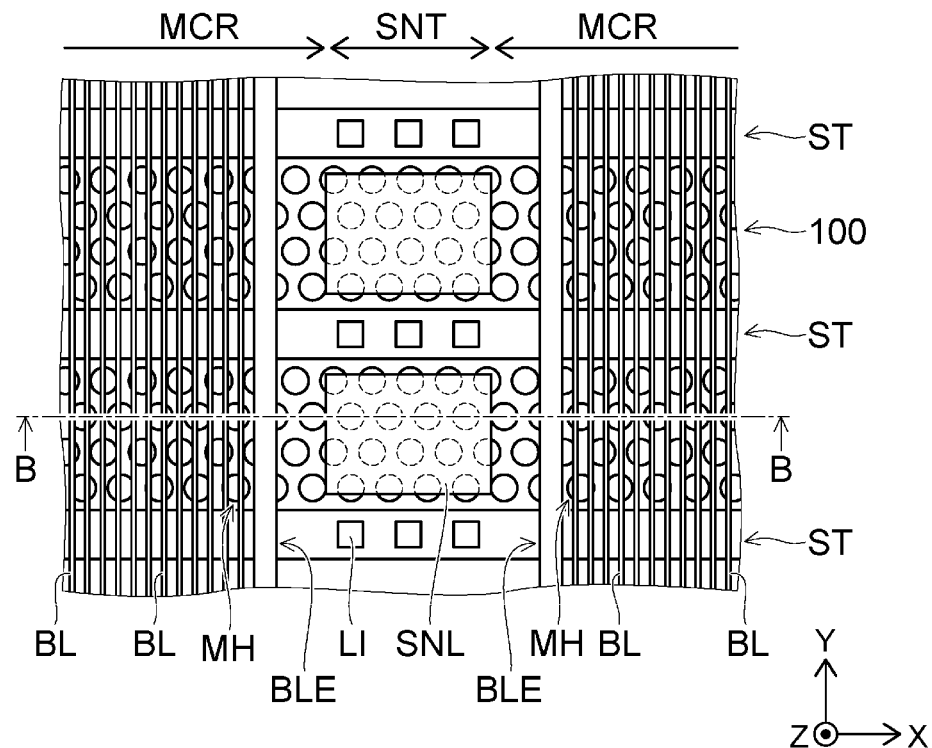
FIGS. 9A and 9B are schematic views illustrating wirings of a memory device according to a second embodiment.
Figure 9B:
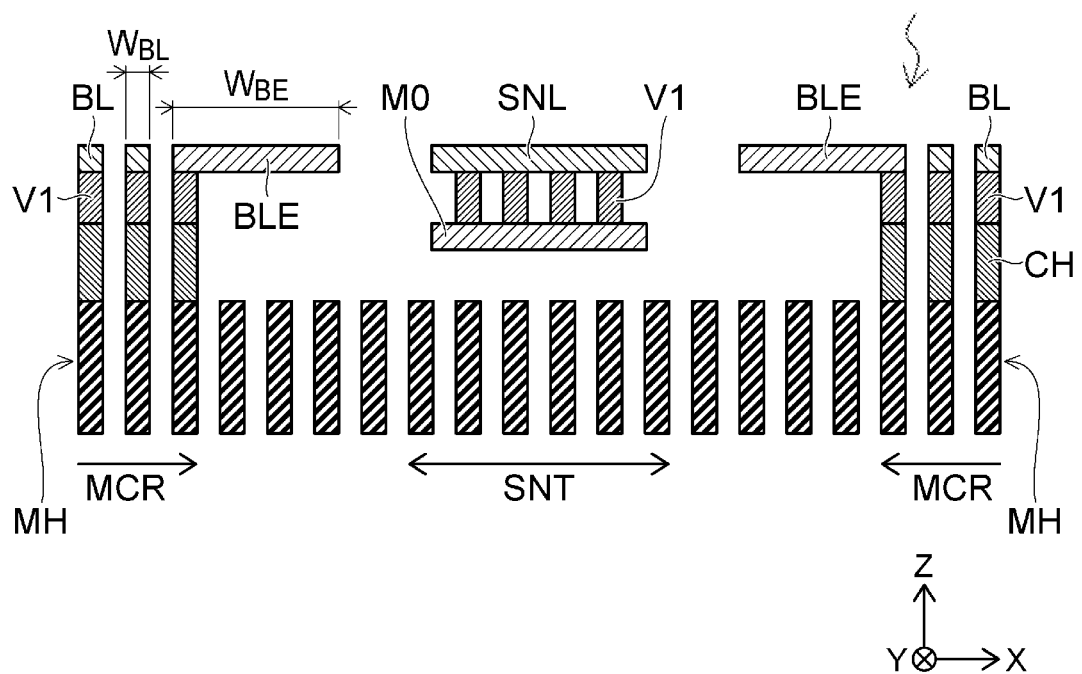

FIGS. 9A and 9B are schematic views illustrating wirings of a memory device 3 according to a second embodiment. FIG. 9A is a plan view illustrating a memory cell array MCA when viewed from the top. FIG. 9B is a cross-sectional view taken along line B-B in FIG. 9A. In FIG. 9B, the word lines WL, the selection gates SGD, and the interlayer insulating films are not illustrated for the sake of convenience.

As illustrated in FIG. 9A, the bit lines BL are provided in the memory cell region MCR and extend in the Y direction. In this example, in a boundary region between the memory cell region MCR and the shunt region SNT, a bit line BLE is located. The bit line BLE is provided such that the width in the X direction is wider than that of each of the other bit lines BL.

As illustrated in FIG. 9B, the bit line BLE is electrically connected to the semiconductor pillar SP (see FIG. 2) via the connection plugs V1 and CH. In this example, no dummy bit line DBL is located between the bit line BLE and the shunt line SNL.

The width $W_{BE}$ of the bit line BLE in the X direction is wider than the widths $W_{BL}$ of the other bit lines BL in the X direction. For example, in the steps illustrated in FIGS. 8A and 8B, the bit line BLE may be formed by leaving the mask layer 23 and the side wall 27 located on the shunt region SNT side. For example, when the width $W_{BL}$ of the bit line BL in the X direction is equal to the interval $W_{BS}$, the width $W_{BE}$ of the bit line BLE in the X direction is about five times the widths $W_{BL}$ of the other bit lines BL in the X direction.

In the embodiment, the electric resistance in the Y direction of the bit line BLE is reduced by setting the width $W_{BE}$ of the bit line BLE in the X direction to be larger than the widths $W_{BL}$ of the other bit lines BL in the X direction. As a result, the read time Tread via the bit line BLE may be shortened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A memory device, comprising:
   a plurality of electrode layers stacked on each other in a stacking direction;
   a plurality of semiconductor pillars penetrating the plurality of electrode layers in the stacking direction;
   a plurality of first wirings disposed above the plurality of electrode layers in the stacking direction at a first level, each first wiring being electrically connected to at least one semiconductor pillar in the plurality of semiconductor pillars; and
   a second wiring disposed above the plurality of electrode layers in the stacking direction at the first level, the second wiring being insulated from the plurality of semiconductor pillars, wherein
   the second wiring and the plurality of first wirings extend in parallel along a first direction intersecting the stacking direction and are spaced from each other in a second direction intersecting the first and stacking directions,
   a width of the second wiring in the second direction is equal to a width of each first wiring in the plurality of first wirings in the second direction, and
   a spacing distance along the second direction between the second wiring and a nearest first wiring in the plurality of first wirings is greater than a spacing interval along the second direction between adjacent first wirings.

2. The memory device according to claim 1, wherein the second wiring is disposed above at least one semiconductor pillar in the plurality of semiconductor pillars.

3. The memory device according to claim 1, wherein
   the spacing interval is substantially equal to the width of each first wiring, and
   the spacing distance is equal to five times the spacing interval.

4. The memory device according to claim 1, wherein the plurality of first wirings are bit line wirings and the second wiring is a dummy bit line wiring.

5. The memory device according to claim 1, further comprising:
   a source line layer disposed under the plurality of electrode layers in the stacking direction; and
   a third wiring disposed above the plurality of electrode layers in the stacking direction and electrically connected to the source line layer, wherein
   the second wiring is between the plurality of first wirings and the third wiring in the second direction.

6. The memory device according to claim 5, wherein the third wiring is a shunt wiring.

7. The memory device according to claim 1, further comprising:
   an interlayer insulating film between the plurality of electrode layers and the first wirings and between the plurality of electrode layers and the second wiring, wherein
   the second wiring is electrically insulated from the plurality of semiconductor pillars by the interlayer insulating film.

8. The memory device according to claim 1, wherein the plurality of first wirings are electrically connected to the plurality of semiconductor pillars via connection plugs extending through an interlayer insulating film in the stacking direction.

9. The memory device according to claim 1, wherein at least one semiconductor pillar in the plurality of semiconductor pillars is covered with a memory film.

10. The memory device according to claim 1, wherein the second wiring is electrically floating and only insulating material is disposed between the second wiring and the nearest first wiring.

11. A memory device, comprising:
    a source line layer;
    a plurality of word line layers stacked on the source line in a stacking direction;
    a plurality of memory holes penetrating the plurality of word line layers in the stacking direction and reaching the source line layer, each memory hole including a semiconductor pillar covered with a memory film;
    a plurality of bit line wirings disposed above the plurality of word line layers in the stacking direction at a first level, each bit line wiring being electrically connected to at least one semiconductor pillar in the plurality of memory holes; and
    a dummy bit line wiring disposed above the plurality of word line layers in the stacking direction at the first level, the dummy bit line wiring being electrically insulated from the plurality of memory holes, wherein
    the dummy bit line wiring and the plurality of bit line wirings extend in parallel along a first direction intersecting the stacking direction and are spaced from each other in a second direction intersecting the first and stacking directions,
    a width of the dummy bit line wiring in the second direction is equal to a width of each bit line wirings in the plurality of bit line wirings in the second direction, and
    a spacing distance along the second direction between the dummy bit line wiring and a nearest bit line wiring in the plurality of bit line wirings is greater than a spacing interval along the second direction between adjacent bit line wirings in the plurality of bit line wirings.

12. The memory device according to claim 11, wherein the spacing interval is substantially equal to the width of each bit line wiring, and the spacing distance is substantially equal to five times the spacing interval.

13. The memory device according to claim 11, further comprising:
    a shunt wiring disposed above the plurality of word line layers in the stacking direction at the first level and electrically connected to the source line layer, wherein
    the dummy bit line wiring is between the shunt wiring and plurality of bit line wirings in the second direction.

14. The memory device according to claim 13, wherein the spacing interval is substantially equal to the width of each bit line wiring, and the spacing distance is substantially equal to five times the spacing interval.

* * * * *